United States Patent
McBrien et al.

(10) Patent No.: US 9,415,438 B2
(45) Date of Patent: Aug. 16, 2016

(54) METHOD FOR FORMING SINGLE CRYSTAL PARTS USING ADDITIVE MANUFACTURING AND REMELT

(71) Applicant: United Technologies Corporation, Hartford, CT (US)

(72) Inventors: John McBrien, South Glastonbury, CT (US); Lea Kennard Castle, Vernon, CT (US); Brandon W. Spangler, Vernon, CT (US)

(73) Assignee: United Technologies Corporation, Hartford, CT (US)

( * ) Notice: Subject to any disclaimer, the term of this patent is extended or adjusted under 35 U.S.C. 154(b) by 323 days.

(21) Appl. No.: 14/250,692

(22) Filed: Apr. 11, 2014

(65) Prior Publication Data

US 2014/0314581 A1     Oct. 23, 2014

Related U.S. Application Data

(60) Provisional application No. 61/813,871, filed on Apr. 19, 2013.

(51) Int. Cl.
*B22C 7/02*     (2006.01)
*B22D 23/06*    (2006.01)
(Continued)

(52) U.S. Cl.
CPC ... *B22C 7/02* (2013.01); *B22C 9/02* (2013.01); *B22C 9/043* (2013.01); *B22C 9/10* (2013.01); *B22C 9/22* (2013.01); *B22D 23/06* (2013.01); *B22F 3/1055* (2013.01); *B22F 5/04* (2013.01); *B23K 15/0006* (2013.01); *B23K 26/342* (2015.10); *B32B 1/08* (2013.01);
(Continued)

(58) Field of Classification Search
CPC .............. B22C 7/02; B22C 9/02; B22C 9/04; B22C 9/043; B22D 23/06
USPC ............ 164/9, 24, 34, 35, 80, 516–529
See application file for complete search history.

(56) References Cited

U.S. PATENT DOCUMENTS

| 4,574,451 A | 3/1986 | Smashey et al. |
| 5,868,194 A * | 2/1999 | Horwood .................. B22C 9/04 164/122.2 |

(Continued)

FOREIGN PATENT DOCUMENTS

| EP | 0815993 A1 | 1/1998 |
| EP | 2319641 A1 | 5/2011 |
| EP | 2570595 A1 | 3/2013 |

OTHER PUBLICATIONS

European Search Report dated Aug. 1, 2014, for corresponding Application No. EP1416970.7.

*Primary Examiner* — Kevin E Yoon
(74) *Attorney, Agent, or Firm* — Kinney & Lange, P.A.

(57) ABSTRACT

A method of forming a metal single crystal turbine component with internal passageways includes forming a polycrystalline turbine blade with internal passageways by additive manufacturing and filling the passageways with a core ceramic slurry. The ceramic slurry is then treated to harden the core and the turbine component is encased in a ceramic shell which is treated to form a ceramic mold. The turbine component in the mold is then melted and directionally solidified in the form of a single crystal. The outer shell and inner ceramic core are then removed to form a finished single crystal turbine component with internal passageways.

9 Claims, 3 Drawing Sheets

(51) Int. Cl.
*F01D 5/28* (2006.01)
*F01D 5/18* (2006.01)
*B22F 3/105* (2006.01)
*B22F 5/04* (2006.01)
*C30B 11/00* (2006.01)
*C30B 29/52* (2006.01)
*B22C 9/04* (2006.01)
*B22C 9/02* (2006.01)
*B22C 9/10* (2006.01)
*B22C 9/22* (2006.01)
*B23K 15/00* (2006.01)
*B32B 1/08* (2006.01)
*B32B 3/08* (2006.01)
*B32B 3/26* (2006.01)
*B32B 5/16* (2006.01)
*B32B 9/00* (2006.01)
*B33Y 10/00* (2015.01)
*B33Y 80/00* (2015.01)

(52) U.S. Cl.
CPC .. *B32B 3/08* (2013.01); *B32B 3/26* (2013.01); *B32B 5/16* (2013.01); *B32B 9/005* (2013.01); *C30B 11/00* (2013.01); *C30B 29/52* (2013.01); *F01D 5/18* (2013.01); *F01D 5/28* (2013.01); *B32B 2250/03* (2013.01); *B32B 2264/105* (2013.01); *B32B 2603/00* (2013.01); *B33Y 10/00* (2014.12); *B33Y 80/00* (2014.12); *F05D 2230/31* (2013.01); *Y02P 10/295* (2015.11)

(56) References Cited

U.S. PATENT DOCUMENTS

| | | | |
|---|---|---|---|
| 5,908,569 | A | 6/1999 | Wilkening et al. |
| 6,932,865 | B2 | 8/2005 | Brice |
| 7,413,001 | B2 * | 8/2008 | Wang .................. B22C 9/10 164/361 |
| 2003/0062145 | A1 | 4/2003 | Frasier et al. |
| 2011/0135952 | A1 | 6/2011 | Morris et al. |
| 2012/0213659 | A1 | 8/2012 | Bayer et al. |
| 2013/0280091 | A1 * | 10/2013 | Propheter-Hinckley .. B22C 9/10 416/97 A |
| 2015/0290707 | A1 * | 10/2015 | Xu ..................... B22D 23/06 264/497 |
| 2015/0321250 | A1 * | 11/2015 | Xu ........................ B23P 6/005 164/15 |
| 2015/0322799 | A1 * | 11/2015 | Xu .......................... F01D 5/18 416/231 R |

* cited by examiner

METHOD FOR FORMING SINGLE CRYSTAL PARTS USING ADDITIVE MANUFACTURING AND REMELT

CROSS-REFERENCE TO RELATED APPLICATION

This application is a non-provisional patent application of Provisional Patent Application Ser. No. 61/813,871, filed Apr. 19, 2013. All references are incorporated herein.

BACKGROUND

This invention relates to forming turbine components by additive manufacturing. In particular, this invention relates to forming single crystal turbine components by additive manufacturing.

Additive manufacturing is a process by which parts can be made in a layer-by-layer fashion by machines that create each layer according to an exact three dimensional (3D) computer model of the part. In powder bed additive manufacturing, a layer of powder is spread on a platform and selective areas are joined by sintering or melting by a directed energy beam. The platform is indexed down, another layer of powder is applied, and selected areas are again joined. The process is repeated for up to thousands of times until a finished 3D part is produced. In direct deposit additive manufacturing technology, small amounts of molten or semi-solid material are applied to a platform according to a 3D model of a part by extrusion, injection, or wire feed and energized by an energy beam to bond the material to form a part. Common additive manufacturing processes include selective laser sintering, direct laser melting, and electron beam melting.

Since a part is produced in a continuous process in an additive manufacturing operation, features associated with conventional manufacturing processes such as machining, forging, welding, casting, etc. can be eliminated leading to savings in cost, material, and time.

Early additive manufacturing products were used, for instance, for 3D design concepts, rapid prototyping of models, and other applications. In the past decade, interest has been growing in the direct fabrication of useful parts across industry.

In the gas turbine industry, methods to directly fabricate components with internal passageways, such as blades and vanes, using additive manufacturing are attracting much attention. An inherent feature of metal parts fabricated by additive manufacturing is that the microstructures are polycrystalline. A number of turbine components require a single crystal microstructure to withstand the high temperature, high stress operating environment in a hot gas stream.

SUMMARY

A method of forming a metal single crystal turbine component with internal passageways includes forming a polycrystalline turbine component with internal passageways by additive manufacturing. The passageways are filled with a core ceramic slurry that is then treated to harden the ceramic core. The polycrystalline component is then encased in a ceramic shell which is treated to form a ceramic shell mold. The turbine component in the shell mold is then melted and directionally solidified in the form of a single crystal. In the last step, the shell mold and ceramic core are removed to form a finished single crystal turbine component with internal passageways.

In an embodiment, a metal single crystal turbine component with internal passageways formed without the use of a ceramic core or wax pattern may be a polycrystalline turbine component formed by an additive manufacturing process that is remelted and directionally solidified in the form of a single crystal.

DETAILED DESCRIPTION

Figure 1:
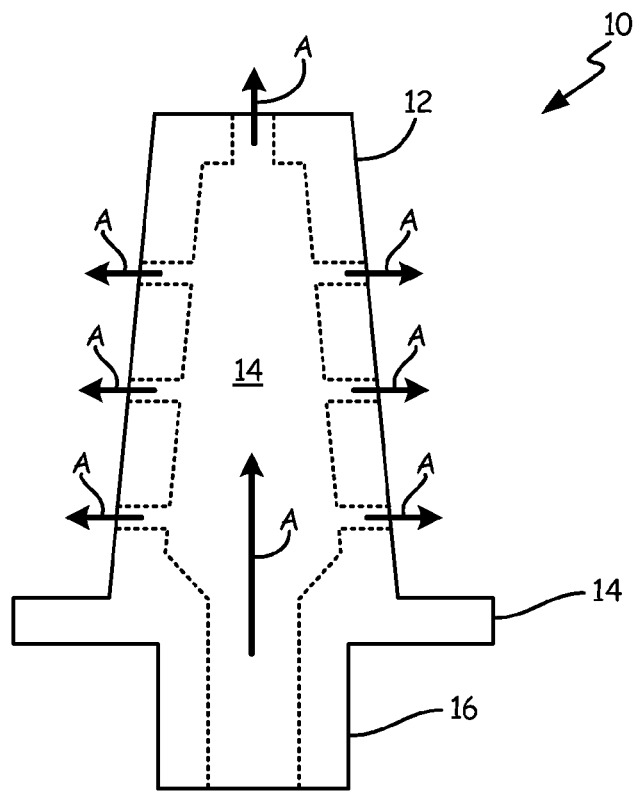
FIG. 1 is a schematic representation of a turbine component with internal passageways.

A schematic representation of a turbine component with internal passageways is shown in FIG. 1. Component 10 may be a turbine blade with airfoil 12, platform 14, and root 16. Turbine blade 10 contains an interior cavity 14 wherein in operation cooling air is directed through component 10 in direction of arrows A to maintain satisfactory operating temperatures during use. Turbine blade 10 may be a high temperature superalloy, such as a nickel based, cobalt based, or iron based superalloy and may be part of a compressor or turbine assembly. Component 10 may also be a stationary vane or nozzle or a combustor liner.

Figure 2:
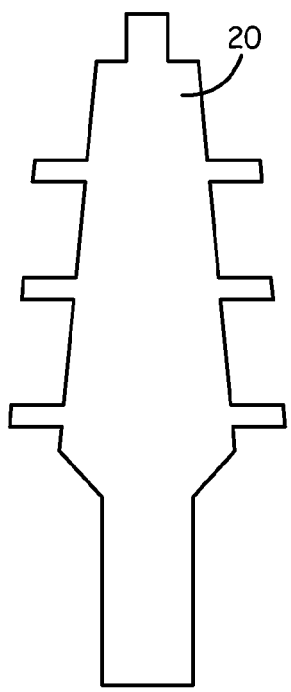
FIG. 2 is a schematic representation of a ceramic core.

In order to resist the high temperature stress environment in the hot gas path of a turbine engine, component 10 may preferably be formed by casting and is preferably a single crystal. Internal passageways in component 10 are formed by ceramic cores in the casting mold. A schematic example of a ceramic core of the invention is shown in FIG. 2. Note ceramic core 20 and cavity 14 in turbine blade 10 have identical shapes. During the casting process, ceramic core 20 displaces the volume of cavity 14 and, when removed from the finished casting, provides the required internal passageways in turbine blade 10 necessary for cooling.

Figure 3:
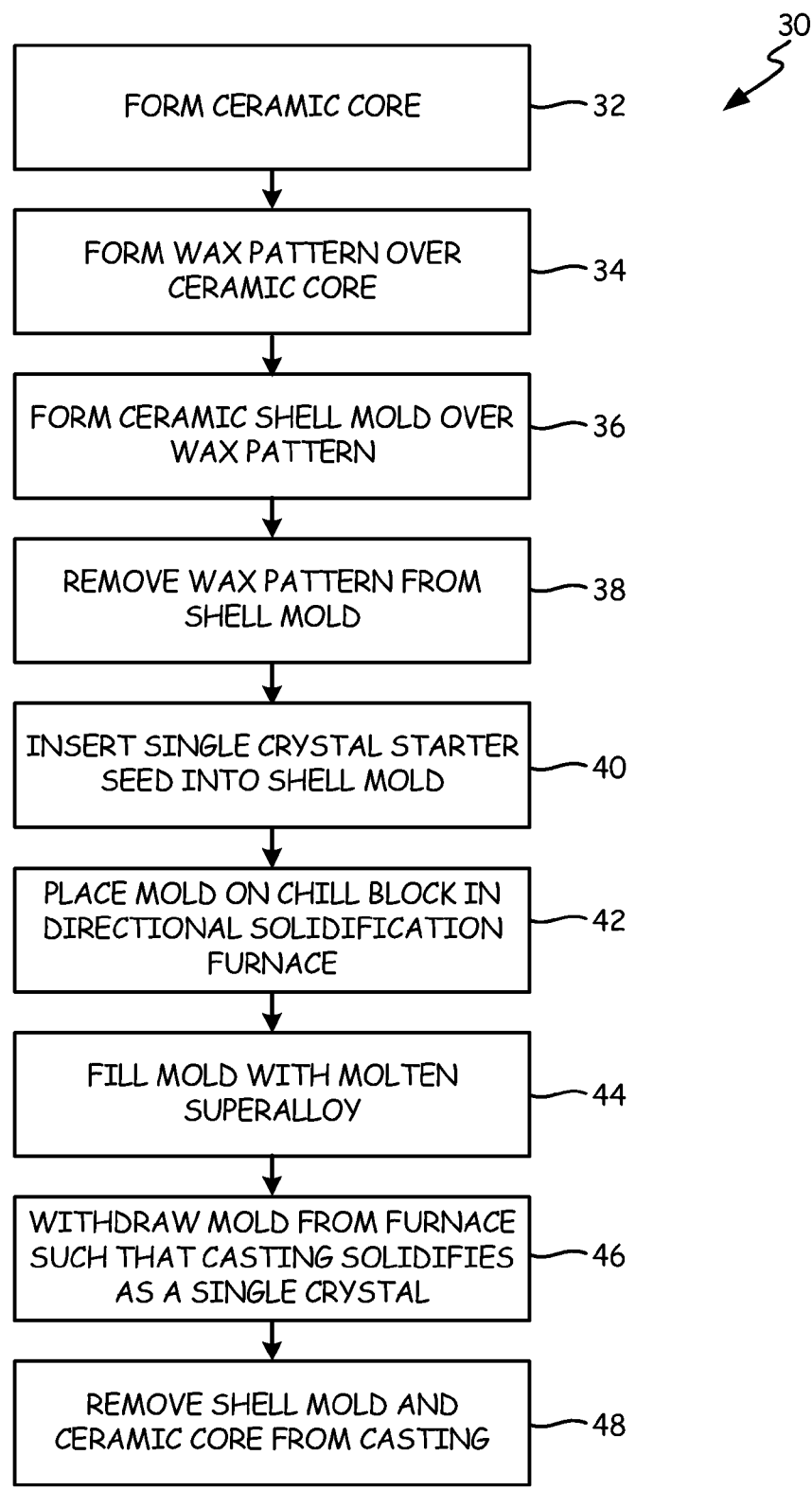
FIG. 3 is a prior art process to form a cast single crystal turbine component with internal passageways.

While not to be limited to any single method for fabricating turbine components, a prior art method for forming a single crystal superalloy turbine blade with internal passageways is shown in FIG. 3. Method 30 is termed a lost wax or shell mold casting process. In method 30, a ceramic core is first formed (Step 32). The ceramic core may commonly be formed from ceramic material such as silica, alumina, zircon, cobalt, mullite, and kaolin. The core may be formed from a ceramic slurry or paste by slip casting, pressing, transfer molding, or injection using a mold. Following molding, the unfired ceramic core may be dried and fired (i.e. bisqued) at an intermediate temperature before high firing to fully sinter and densify the body.

In the next step, a wax pattern of the component may be cast over the ceramic core (Step 34). The pattern has the identical shape of the required finished turbine component.

A shell mold may then be formed over the wax pattern and ceramic core (Step 34). In this process, the wax pattern containing the ceramic core may be dipped into a slurry of shell mold ceramic powder and binder to form a layer of ceramic on the pattern. The layer may be dried and the process may be repeated for as many times necessary to form a green (i.e. unfired) ceramic shell mold. The thickness of the green ceramic shell mold at this step may be from about 5 mm to about 32 mm. The green shell mold may then be fired at an intermediate temperature (i.e. bisque fired) to partially sinter the ceramic and burn off the binder material. The mold may then be fired at a temperature between about 1200° F. (649° C.) to about 1800° F. (982° C.) from about 10 to about 120 minutes to sinter the ceramic to full density to form the shell mold. Before or during firing the ceramic shell, the wax melts and flows out of the shell mold leaving a cavity for casting (Step 38).

A single crystal starter seed or grain selector may be attached to the bottom of the mold to enable a single crystal to form when casting the component (Step 40).

The finished mold may then be placed on a chill block in a directional solidification furnace (Step 42). Single or multiple molds may be used when casting turbine components such as blades or vanes using mold arrangements known in the art. The directional solidification furnace has a hot zone and cold zone separated by an isolation valve. The hot zone is preferably induction heated. The chill block and mold may be elevated into the hot zone and filled with molten super alloy (Step 44). After the pour, the chill plate may descend into the cold chamber causing a solid/liquid interface to advance from the partially molten starter seed in the form of a single crystallographic oriented component whose orientation is dictated by the orientation of the starter seed. Casting is performed under an inert atmosphere or vacuum to preserve the purity of the casting.

Following casting, the shell mold may be removed from the solidified component. The ceramic core may also be removed, typically by caustic leaching, to leave the finished single crystal component (Step 48).

It is the purpose of the present invention to produce a finished superalloy turbine component by additive manufacturing and to use the finished component as a pattern in the shell mold process just described. In this case, however, the pattern is not wax and may be, instead, a polycrystalline superalloy component formed by additive manufacturing. The polycrystalline pattern may be encased in a shell mold and remelted and directionally solidified into a single crystal.

Figure 4:
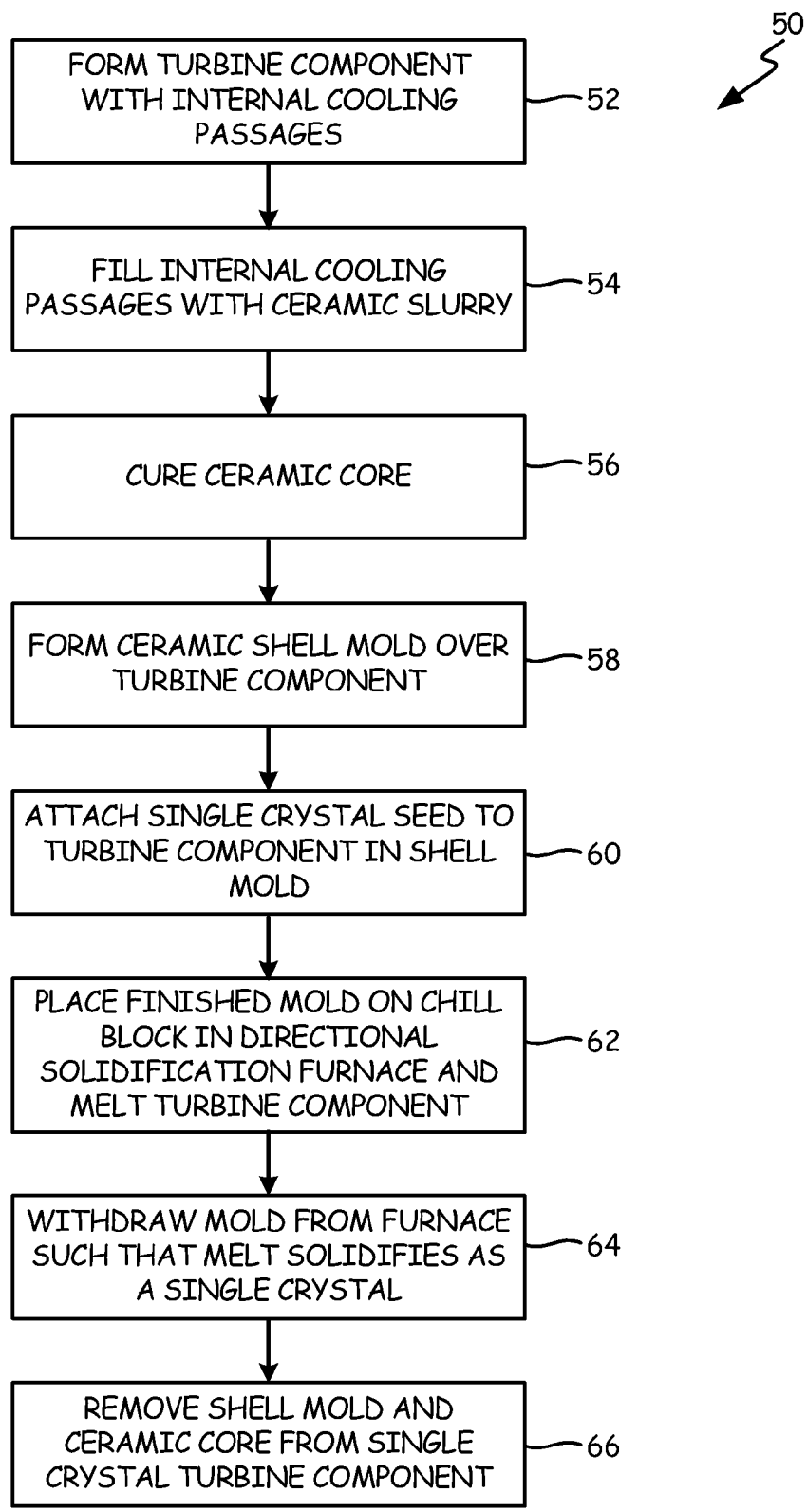
FIG. 4 is a process to form a single crystal turbine component with internal passageways according to the invention.

Process 50 of the present invention is shown in FIG. 4.

In the first step, a superalloy turbine component (e.g. a turbine blade or vane) with internal cooling passages may be formed by additive manufacturing. The additive manufacturing processes used may include powder bed and direct deposition processes including, but not limited to, selective laser sintering, selective laser melting, direct metal deposition, direct metal laser sintering, direct metal laser melting, electron beam melting, and others known in the art.

In the next step, the internal cooling passages of the component may be filled with core ceramic slurry (Step 54). The slurry may comprise ceramics commonly used as core materials including, but not limited to, silica, alumina, zircon, cobalt, mullite, and kaolin.

In the next step, the ceramic core may be cured in situ in the component by a suitable thermal process if necessary (Step 56).

A ceramic shell may then be formed over the polycrystalline component and internal ceramic core (Step 58). In this process, the component and ceramic core may be dipped into a slurry of shell mold ceramic powder and binder to form a layer of ceramic. The layer is dried and the process repeated for as many times as necessary to form a green (i.e. unfired) ceramic shell mold. The thickness of the green ceramic shell mold at this step may be from about 5 mm to about 32 mm. The green shell mold may then be bisque fired at an intermediate temperature to partially sinter the ceramic and burn off the binder material. The mold may then be high fired at a temperature between about 1200° F. (649° C.) to about 1800° F. (982° C.) from about 10 to about 120 minutes to sinter the ceramic to full density to form the shell mold.

A single crystal starter seed or grain selector may be attached to the bottom of the mold to enable a single crystallographic oriented component to form when resolidifying the component after remelting (Step 60).

The finished mold containing the polycrystalline turbine component may then be placed on a chill block in a directional solidification furnace maintained at a temperature higher than the melting point of the component to melt the component (Step 62). The chill block may be positioned such that only a portion of the starter seed crystal or grain selector melt. The mold may then be withdrawn from the hot zone into the cold zone of the furnace, causing a solid/liquid interface to advance in the form of a single crystallographic oriented component whose orientation is dictated by the orientation of the starter seed (Step 66).

Following resolidification, the shell mold may be removed from the solidified component (Step 66). The ceramic core may also be removed, typically by caustic leaching to leave the finished single crystal component.

DISCUSSION OF POSSIBLE EMBODIMENTS

The following are non-exclusive descriptions of possible embodiments of the present invention.

A method of forming a single crystal turbine component with internal passageways includes forming a polycrystalline metal component with internal passageways by an additive manufacturing process; filling the internal passageways with a core ceramic slurry; treating the ceramic slurry to form a ceramic core; encasing the metal component in a ceramic shell; treating the ceramic shell to form a ceramic mold; placing the ceramic mold in a furnace and melting the metal component; directionally solidifying the melt to form a single crystal turbine component; and cooling the mold, removing the outer shell and inner ceramic core to reveal a finished single crystal turbine component with internal passageways.

The method of the preceding paragraph can optionally include, additionally, and/or alternatively any, one or more of the following features, configurations, and/or additional components.

Additive manufacturing process may include at least one of selective laser sintering, selective laser melting, direct metal deposition, direct metal laser sintering, direct metal laser melting, and electron beam melting.

The metal may be selected from a group consisting of a nickel based superalloy, cobalt based superalloy, iron based superalloy, and mixtures thereof.

The core ceramic material may be selected from a group consisting of silica, alumina, zircon, cobalt, mullite, and kaolin.

The means to form a single crystal comprise a starter seed or grain selector.

The ceramic shell material may be selected from a group consisting of silica, alumina, zircon, cobalt, mullite, and kaolin, or mixtures thereof.

The ceramic shell may be formed by a repeated process of dipping in a ceramic slurry to form a layer of shell mold ceramic on the component, drying the layer, and repeating the process until an acceptable shell mold thickness is formed.

Treating the ceramic slurry to form a ceramic core may include heating the ceramic to sinter the ceramic.

The shell mold may be fired between temps of 1200° F. (649° C.) and 1800° F. (982° C.) for times between about 10 minutes and about 120 minutes.

A metal single crystal turbine component with internal passageways formed without the use of a wax pattern may include a polycrystalline turbine component with internal passageways formed by an additive manufacturing process that is remelted and directionally solidified to form a single crystal.

The component of the preceding paragraph can optionally include, additionally, and/or any, one or more of the following features, configurations, and/or additional components:

The internal passageways may be filled with core ceramic before remelting.

The polycrystalline turbine component and ceramic core may be encased in a shell mold before remelting.

The core ceramic material may be selected from the group consisting of silica, alumina, zircon, cobalt, mullite, and kaolin, and mixtures thereof The shell mold material may be selected from the group consisting of silica, alumina, zircon, cobalt, mullite, and kaolin.

The additive manufacturing process may include at least one of selective laser sintering, selective laser melting, direct metal deposition, direct metal laser melting, and electron beam melting.

The metal may be selected from a group consisting of a nickel based superalloy, a cobalt based superalloy, an iron based superalloy, and mixtures thereof.

The polycrystalline component may be attached to a starter seed or grain selector before remelting.

The shell mold may be fired between temps of 1200° F. (649° C.) and 1800° F. (982° C.) for times between about 10 minutes and about 120 minutes.

Although the present invention has been described with reference to preferred embodiments, workers skilled in the art will recognize that changes may be made in form and detail without departing from the spirit and scope of the invention.

The invention claimed is:

1. A method of forming a metal single crystal turbine component with internal passageways comprising:
    forming a polycrystalline metal turbine component with internal passageways by an additive manufacturing process;
    filling the internal passageways with a core ceramic slurry;
    treating the ceramic slurry to form a ceramic core;
    encasing the metal component in a ceramic shell;
    treating the ceramic shell to form a ceramic mold;
    placing the ceramic mold in a furnace and melting the metal turbine component;
    directionally solidifying the melt to form a metal single crystal turbine; and
    cooling the mold, removing the outer shell and inner ceramic core to reveal a finished metal single crystal turbine component with internal passageways.

2. The method of claim 1, wherein additive manufacturing process comprises at least one of selective laser sintering, selective laser melting, direct metal deposition, direct metal laser sintering, direct metal laser melting, and electron beam melting.

3. The method of claim 1, wherein the metal is selected from the group consisting of a nickel based superalloy, cobalt based superalloy, iron based superalloy, and mixtures thereof.

4. The method of claim 1, wherein the core ceramic material is selected from the group consisting of silica, alumina, zircon, cobalt, mullite, and kaolin.

5. The method of claim 1, wherein the metal single crystal turbine component is formed using a starter seed or grain selector in conjunction with directional solidification.

6. The method of claim 1, wherein the ceramic shell material is selected from the group consisting of silica, alumina, zircon, cobalt, mullite, and kaolin, or mixtures thereof.

7. The method of claim 1, wherein the ceramic shell is formed by a repeated process of dipping in a ceramic slurry to form a layer of shell mold ceramic on the component, drying the layer, and repeating the process until an acceptable shell mold thickness is formed.

8. The method of claim 1, wherein treating the ceramic slurry to form a ceramic core may comprise heating the ceramic core to sinter the ceramic core.

9. The method of claim 7, wherein the shell mold is fired between temperatures of about 1200° F. (649° C.) and about 1800° F. (982° C.) for times between about 10 and about 120 minutes.

* * * * *